United States Patent
Xia et al.

(10) Patent No.: US 12,099,749 B2
(45) Date of Patent: Sep. 24, 2024

(54) DATA READ/WRITE METHOD AND APPARATUS, AND EXCHANGE CHIP AND STORAGE MEDIUM

(71) Applicant: SUZHOU CENTEC COMMUNICATIONS CO., LTD., Jiangsu (CN)

(72) Inventors: Jie Xia, Suzhou (CN); Jun Xu, Suzhou (CN); Guobing Teng, Suzhou (CN)

(73) Assignee: SUZHOU CENTEC COMMUNICATIONS CO., LTD., Jiangsu (CN)

( * ) Notice: Subject to any disclaimer, the term of this patent is extended or adjusted under 35 U.S.C. 154(b) by 379 days.

(21) Appl. No.: 17/423,205

(22) PCT Filed: Jun. 5, 2019

(86) PCT No.: PCT/CN2019/090211
§ 371 (c)(1),
(2) Date: Jul. 15, 2021

(87) PCT Pub. No.: WO2020/147253
PCT Pub. Date: Jul. 23, 2020

(65) Prior Publication Data
US 2022/0066699 A1   Mar. 3, 2022

(30) Foreign Application Priority Data
Jan. 16, 2019 (CN) .......................... 201910041299.8

(51) Int. Cl.
*G06F 3/06* (2006.01)
*G06F 1/08* (2006.01)
(52) U.S. Cl.
CPC .............. *G06F 3/0659* (2013.01); *G06F 1/08* (2013.01); *G06F 3/0604* (2013.01); *G06F 3/0631* (2013.01); *G06F 3/0679* (2013.01)

(58) Field of Classification Search
CPC .... G06F 3/0659; G06F 3/0604; G06F 3/0631; G06F 3/0679; G06F 1/08
See application file for complete search history.

(56) References Cited

U.S. PATENT DOCUMENTS

| 6,212,597 | B1 * | 4/2001 | Conlin | ............... G06F 13/16 711/149 |
| 11,347,297 | B1 * | 5/2022 | Ko | ............... G06F 1/3275 |

(Continued)

FOREIGN PATENT DOCUMENTS

| CN | 101699413 A | 4/2010 |
| CN | 101493755 B | 8/2010 |

(Continued)

OTHER PUBLICATIONS

International Search Report in the international application No. PCT/CN2019/090211, mailed on Oct. 18, 2019, 3 pgs.

(Continued)

*Primary Examiner* — Prasith Thammavong
(74) *Attorney, Agent, or Firm* — Cooper Legal Group, LLC

(57) ABSTRACT

Disclosed are a data read/write method and apparatus, and an exchange chip and a storage medium. The method comprises: when the current clock cycle arrives, a kernel acquiring a read/write instruction that needs to be executed in the current clock cycle; the kernel acquiring a target storage area associated with the read/write instruction, wherein the target storage area is an unoccupied storage area in at least two storage areas in a random access memory (RAM); and the kernel performing, according to the read/write instruction, data reading and writing on the target storage area in the current clock cycle.

16 Claims, 8 Drawing Sheets

(56) References Cited

U.S. PATENT DOCUMENTS

| | | | | |
|---|---|---|---|---|
| 2005/0001846 | A1* | 1/2005 | Shiono | G09G 5/001 |
| | | | | 345/531 |
| 2006/0129720 | A1* | 6/2006 | Taniguchi | G06F 13/405 |
| | | | | 710/58 |
| 2011/0249485 | A1 | 10/2011 | Fujita | |
| 2019/0196961 | A1 | 6/2019 | Li et al. | |

FOREIGN PATENT DOCUMENTS

| | | |
|---|---|---|
| CN | 102045258 A | 5/2011 |
| CN | 104115127 A | 10/2014 |
| CN | 105740164 A | 7/2016 |
| CN | 106201355 A | 12/2016 |
| CN | 106294202 A | 1/2017 |
| CN | 106802775 A | 6/2017 |
| CN | 108156823 A | 6/2018 |
| CN | 108647176 A | 10/2018 |
| CN | 108932112 A | 12/2018 |
| EP | 0866399 A2 | 9/1998 |

OTHER PUBLICATIONS

English translation of the Written Opinion of the International Search Authority in the international application No. PCT/CN2019/090211, mailed on Oct. 18, 2019, 4 pgs.

\* cited by examiner

DATA READ/WRITE METHOD AND APPARATUS, AND EXCHANGE CHIP AND STORAGE MEDIUM

CROSS-REFERENCE TO RELATED APPLICATION

This application is filed based upon and claims priority to Chinese Patent Application No. 201910041299.8, filed on Jan. 16, 2019, the disclosure of which is hereby incorporated by reference in its entirety.

TECHNICAL FIELD

The disclosure relates to switch chip message buffer technologies, and particularly, but not limited, to a data read/write method and device, a switch chip, and a storage medium.

BACKGROUND

With the constant development of computer technologies, ultra wide band switch chip has been used widely, and a capacity of a buffer thereof is one of important indicators for evaluating the performance of the chip. For achieving a higher switch capacity, a buffer needs to meet a multi-read and multi-write requirement. However, limited to a memory structure, a multi-read and multi-write buffer cannot achieve a high frequency or an area cost may be high.

SUMMARY

In view of this, embodiments of the disclosure are intended to provide a data read/write method and device, a switch chip, and a storage medium.

The embodiments of the disclosure provide a data read/write method, which includes the following operations.

When a present clock cycle comes, a core acquires a read/write instruction required to be executed in the present clock cycle.

The core acquires a target storage region associated with the read/write instruction, the target storage region being an unoccupied storage region in at least two storage regions in a Random Access Memory (RAM).

The core performs data read/write on the target storage region in the present clock cycle according to the read/write instruction.

The embodiments of the disclosure provide a data read/write device, which includes a first acquisition unit, a second acquisition unit, and a read/write unit.

The first acquisition unit is configured to, when a present clock cycle comes, acquire a read/write instruction required to be executed in the present clock cycle.

The second acquisition unit is configured to acquire a target storage region associated with the read/write instruction, the target storage region being an unoccupied storage region in at least two storage regions in a RAM.

The read/write unit is configured to perform data read/write on the target storage region in the present clock cycle according to the read/write instruction.

The embodiments of the disclosure also provide a switch chip, which includes a core and a RAM, the core being configured to implement the abovementioned data read/write method.

The embodiments of the disclosure also provide a computer-readable storage medium having stored therein a computer-executable instruction, the computer-executable instruction being configured to execute the abovementioned data read/write method.

With the technical solutions provided in the embodiments of the disclosure, a multi-read multi-write effect of a whole buffer is achieved by dividing multiple storage regions for one-read one-write. A configuration manner is flexible, the structure is simple, the utilization rate of the memory may be effectively increased, and a frequency requirement of an ultra-wide band switch chip may be met.

DETAILED DESCRIPTION

In an ultra-wide band switch chip, a capacity of a buffer is one of the most important indicators. At present, all ultra-wide band switch chips are above 1 Tera (1 T) bits per second (1 T bits are 1,024 gigabits), and buffer capacities of switch chips with higher capacities such as 3.2 T, 6.4 T, 12.8 T, and 25.6 T switch chips are also constantly increased. For supporting an ultra-wide band switch capacity, a certain read/write requirement is made to a buffer.

Figure 1A:
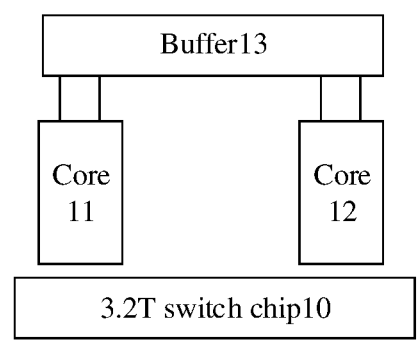
FIG. 1A is a composition structure diagram of a 3.2 T switch chip.
Figure 1B:
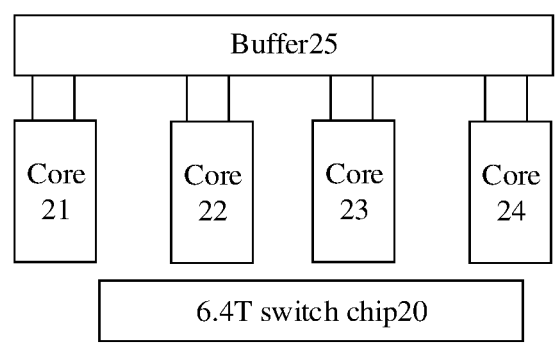
FIG. 1B is a composition structure diagram of a 6.4 T switch chip.

Due to process limits, embedded memories and logics may achieve limited clock frequencies. For example, in a Taiwan Semiconductor Manufacturing Company (TSMC) 16 nm process, a clock frequency of a switch chip may achieve at most about 1.2 G, and for satisfying 3.2 T, 6.4 T, and even higher switch capacities, multiple processing logic cores are needed to concurrently process data and concurrently read/write processed data from/to a buffer that buffers messages. As shown in FIG. 1A, a 3.2 T switch chip 10 uses two switch cores (a core 11 and a core 12) corresponding to one message storage buffer (a buffer 13). The buffer needs a two-read two-write interface. As shown in FIG. 1B, a 6.4 T switch chip 20 uses four switch cores (a core 21, a core 22, a core 23, and a core 24) corresponding to one message storage buffer (a buffer 25). The buffer needs a four-read four-write interface. Limited to a memory structure, a multi-read multi-write buffer may not achieve a high frequency or an area cost thereof may be enormous.

Figure 1C:
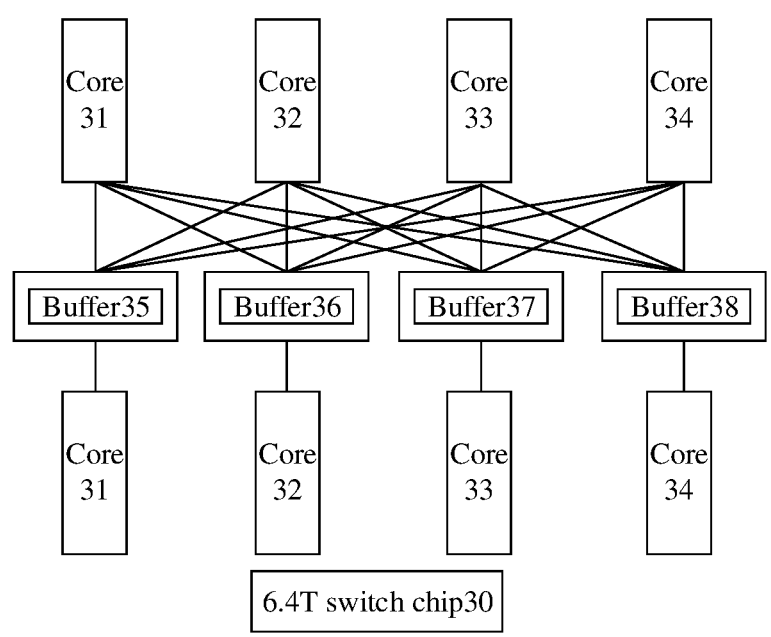
FIG. 1C is a composition structure diagram of another 6.4 T switch chip.

In a related art, for satisfying a switch capacity, a buffer may be divided into a plurality of blocks, and each core occupies a block. As shown in FIG. 1C, taking a 6.4 T switch chip 30 as an example, a 32M buffer is divided into four 8M one-read four-write buffers (i.e., a buffer 35, a buffer 36, a buffer 37, and a buffer 38 respectively) that correspond to four cores (a core 31, a core 32, a core 33, and a core 34), thereby implementing a four-read four-write buffer.

In such a division manner, a four-read four-write buffer is split into four one-read four-write buffers, so that the design complexity of the buffer is reduced. However, there is also brought another problem that at most one-fourth of a buffer capacity may be used to forward a message to any core and thus a utilization rate of the buffer is reduced.

In the related art, another solution may also be adopted, i.e., a time division multiplexing manner Still taking 6.4 T 4Core as an example, if a clock frequency is 1.2 G, and a forwarding capacity of a single core for messages of above 256 Bytes may reach 1.6 T, a data bit width of a single core is about 320 Bytes. The solution is implemented as follows. A data bit width of a buffer is extended to four times, namely the data bit width of the buffer is 1,280 Bytes. Time is divided into four periods, and a core performs read and write in each period. A data bit width read/written by a core every time is four times the original data bit width, i.e., 1,280 Bytes. On average, this is equivalent to that each core still reads/writes the buffer once in each time period, thereby realizing a four-read four-write function.

However, such a bit width extension manner finally causes the condition that data stored by a core at one time may belong to two or more messages, and such a complex design often costs more.

The embodiments of the disclosure are intended to propose optimization of read/write scheduling of a message memory for implementation of a multi-read multi-write buffer using a one-read one-write RAM. Not only is the chip cost greatly reduced, but also a design requirement is met, each core may share all storage spaces, and a simple design and ease of implementation are ensured.

Descriptions will be made below in combination with embodiments.

An embodiment of the disclosure provides a data read/write method. The method is applied to a switch chip. When executing the method, the switch chip may implement rapid read/write through a simple storage structure. A function realized in the method may be realized through a core in the switch chip by calling a program code or through a hardware logic.

Figure 2:
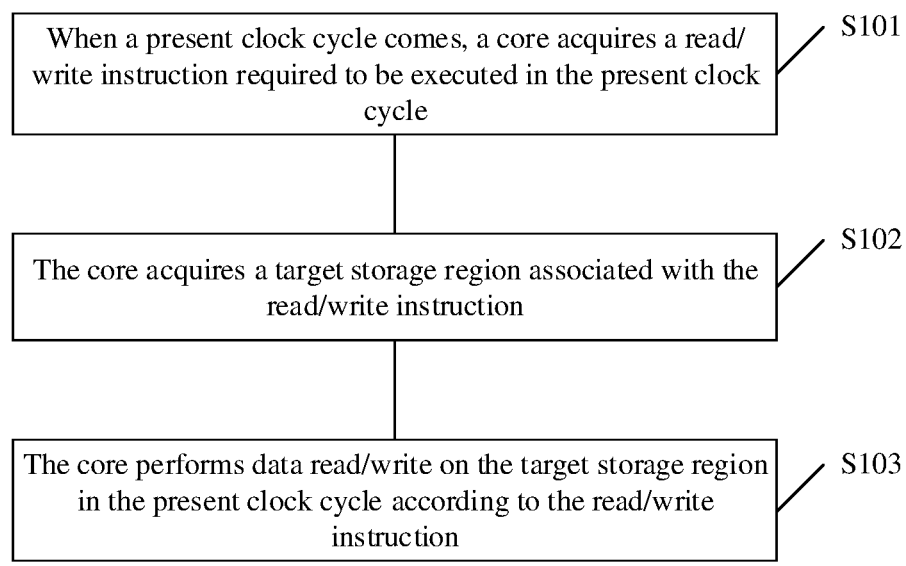
FIG. 2 is an implementation flowchart of a data read/write method according to an embodiment of the disclosure.

FIG. 2 is an implementation flowchart of a data read/write method according to an embodiment of the disclosure. As shown in FIG. 2, the method includes the following operations.

In S101, when a present clock cycle comes, a core acquires a read/write instruction required to be executed in the present clock cycle.

In the present clock cycle, the core is intended to perform data read/write on a buffer according to the acquired read/write instruction to write data corresponding to the acquired write instruction to a storage region and read data from the buffer according to the acquired read instruction. Therefore, the core is required to acquire the read/write instruction required to be executed when the present clock cycle comes.

In S102, the core acquires a target storage region associated with the read/write instruction, the target storage region being an unoccupied storage region in at least two storage regions in a RAM.

Here, a storage space of the RAM is equally divided into a plurality of storage regions, each core acquires a respective target storage region associated with a read/write instruction in the same clock cycle, and different cores correspond to different target storage regions in the same clock cycle. As such, when a core reads/writes, conflicts with other cores may be avoided, and one-read one-write in each storage region may be ensured. Therefore, it is necessary here to determine a respective different storage region corresponding to the read/write instructions of each core and perform data read/write respectively in the present clock cycle, to enable multiple cores to simultaneously write or read in the same clock cycle with each core occupying only one target storage region, so as to avoiding conflicts.

In S103, the core performs data read/write on the target storage region in the present clock cycle according to the read/write instruction.

When each core determines the corresponding target storage region to be read/written by the core in the present clock cycle, each core performs a corresponding read/write operation in the present clock cycle according to the read/write instruction. Therefore, multi-read multi-write of the whole memory is implemented by one-read one-write in each storage region.

An embodiment of the disclosure provides another data read/write method, which includes the following operations.

In S201, before a present clock cycle comes, a core determines an unoccupied storage region in at least two storage regions in a RAM.

In S202, when the present clock cycle comes, the core acquires a read/write instruction required to be executed in the present clock cycle.

In S203, the core acquires a target storage region associated with the read/write instruction, the target storage region being the unoccupied storage region in the at least two storage regions in the RAM.

In S204, the core performs data read/write on the target storage region in the present clock cycle according to the read/write instruction.

An implementation of determining the unoccupied storage region is provided in S201. Before the present clock cycle comes, each core selects and determines a storage region required to be occupied by the core in the present clock cycle from multiple storage regions. Each core, when selecting the storage region, is required to determine that the storage region selected by the core is not selected by another core. Therefore, a pipeline may be adopted, namely each core notifies the other cores after selecting the storage region, and then the other cores select their own corresponding storage regions. These operations are performed before the present clock cycle comes, and may be completed within multiple clock cycles. Therefore, each core may select a storage region that may not be occupied by the other cores, and directly perform data read/write without conflicts when the present clock cycle comes.

An embodiment of the disclosure provides another data read/write method, which includes the following operations.

In S301, before a present clock cycle comes, a core acquires its own sequence number in the present clock cycle.

The sequence number is a position number of each core in a priority queue corresponding to the present clock cycle.

In S302, a storage region that is not selected by other cores is determined as an unoccupied storage region according to storage regions selected by the other cores whose sequence numbers are before the sequence number.

In S303, when the present clock cycle comes, the core acquires a read/write instruction required to be executed in the present clock cycle.

In S304, the core acquires a target storage region associated with the read/write instruction, the target storage region being the unoccupied storage region in at least two storage regions in a RAM.

In S305, the core performs data read/write on the target storage region in the present clock cycle according to the read/write instruction.

An implementation of S201 is provided by operations in S301 and S302. All cores may form a priority queue in each clock cycle according to a certain rule, and different priority queues are formed in different cycles in a period of time, so it is fair to each core in long time. After determining the own sequence number in the present clock cycle, the core selects the target storage region according to the sequence number. For example, when the own sequence number is the first, the core is the first to select the storage region corresponding to the present clock cycle, and no other cores have selected storage regions corresponding to the present clock cycle, so the first core selects the storage region according to its own requirement. When the own sequence number is the second, selection is performed after the first core completes selection, and only another storage region that is not selected by the first core may be selected. This process is still performed before the present clock cycle comes. When the present clock cycle comes, each core has completed its selection, and directly performs data read/write on a respective target storage region corresponding to each core.

An embodiment of the disclosure provides another data read/write method, which includes the following operations.

In S401, before a present clock cycle comes, a core acquires its own sequence number in the present clock cycle.

The sequence number is a position number of each core in a priority queue corresponding to the present clock cycle.

In S402, a first storage region set selected by other cores whose sequence numbers are before the sequence number is determined.

In S403, an unselected second storage region set is determined according to all storage regions of a RAM and the first storage region set.

In S404, a storage region in the second storage region set is determined as an unoccupied storage region.

In S405, when the present clock cycle comes, the core acquires a read/write instruction required to be executed in the present clock cycle.

In S406, the core acquires a target storage region associated with the read/write instruction, the target storage region being the unoccupied storage region in at least two storage regions in the RAM.

In S407, the core performs data read/write on the target storage region in the present clock cycle according to the read/write instruction.

An implementation of S302 is provided by operations in S402 to S404. When the own sequence number of the core is not the first, which storage regions are not selected by the other core is required to be determined. In such case, the core may determine storage regions selected by the other cores whose sequence numbers are before its own sequence number as the first storage region set, remove each storage region in the first storage region set from the storage regions, and determine the other storage regions as the second storage region set. Each storage region in the second storage region set has yet not been selected by the other core, so that the storage region in the second storage region set may be determined as the target storage region. Here, there may be one or more target storage regions.

An embodiment of the disclosure provides another data read/write method, which includes the following operations.

In S501, before a present clock cycle comes, a core acquires its own sequence number in the present clock cycle.

The sequence number is a position number of each core in a priority queue corresponding to the present clock cycle.

In S502, the core determines a first storage region set selected by other cores whose sequence numbers are before the sequence number.

In S503, the core determines an unselected second storage region set according to all storage regions of a RAM and the first storage region set.

In S504, the core determines a storage region in the second storage region set as an unoccupied storage region.

In S505, the core stores a read instruction in a respective instruction queue corresponding to each storage region.

In S506, when the present clock cycle comes, the core acquires a read instruction required to be executed in the present clock cycle from the instruction queue.

In S507, the core acquires a target storage region associated with the read instruction, the target storage region being the unoccupied storage region in at least two storage regions in the RAM.

In S508, the core reads data from the target storage region in the present clock cycle according to the read instruction.

A method that a core pre-stores a read instruction is provided by operations in S505 and S506. Each core creates X queues corresponding to X storage regions one to one, and when the present clock cycle comes, extracts and executes a read instruction required to be executed in the queue, thereby performing data read.

An embodiment of the disclosure provides another data read/write method, which includes the following operations.

In S601, before a present clock cycle comes, a core acquires its own sequence number in the present clock cycle.

The sequence number is a position number of each core in a priority queue corresponding to the present clock cycle.

In S602, the core determines a first storage region set selected by other cores whose sequence numbers are before the sequence number.

In S603, the core determines an unselected second storage region set according to all storage regions of a RAM and the first storage region set.

In S604, the core determines a storage region in the second storage region set as an unoccupied storage region.

In S605, the core stores a read instruction in a respective instruction queue corresponding to each storage region.

In S606, when the present clock cycle comes, the core acquires a read instruction required to be executed in the present clock cycle from the instruction queue.

In S607, the core determines an identifier of a target storage region corresponding to the instruction queue according to an identifier of the instruction queue where the read instruction is located.

In S608, an unoccupied storage region in a storage region corresponding to the identifier of the target storage region is determined as the target storage region.

In S609, the core reads data from the target storage region in the present clock cycle according to the read instruction.

An implementation of S507 is provided by operations in S607 and S608. Each read instruction is correspondingly stored in the respective instruction queue. Each instruction queue corresponds to each storage region one to one, so the identifier of the target storage region may be determined according to the identifier of the instruction queue where the read instruction is located. The storage region that is not occupied by the other core is determined as the target storage region according to the identifier of the target storage region.

An embodiment of the disclosure provides another data read/write method, which includes the following operations.

In S701, before a present clock cycle comes, a core acquires its own sequence number in the present clock cycle.

The sequence number is a position number of each core in a priority queue corresponding to the present clock cycle.

In S702, a first storage region set selected by other cores whose sequence numbers are before the sequence number is determined.

In S703, an unselected second storage region set is determined according to all storage regions of a RAM and the first storage region set.

In S704, a storage region in the second storage region set is determined as an unoccupied storage region.

In S705, the core stores a read/write instruction in a respective instruction queue corresponding to each storage region.

In S706, when the present clock cycle comes, the core acquires a read/write instruction required to be executed in the present clock cycle from the instruction queue.

In S707, the core determines an identifier of a target storage region corresponding to the instruction queue according to an identifier of the instruction queue where the read/write instruction is located.

In S708, a third storage region set corresponding to a read instruction is determined according to the identifier of the target storage region.

In S709, an intersection of the third storage region set and the second storage region set is determined as a fourth storage region set.

In S710, a storage region in the fourth storage region set is determined as the target storage region.

In S711, the core performs data read/write on the target storage region in the present clock cycle according to the read/write instruction.

An implementation of S608 when the read/write instruction is a read instruction is provided by operations in S708 to S710. When determining the second storage region set that is not selected by the other cores, the core is also required to determine its own read requirement. The third storage region set required to be read by the core is determined according to the read instruction. Then, the intersection of the third storage region set and the second storage region set is determined as the fourth storage region set. In such case, the storage region in the fourth storage region set is not only a storage region that is not selected by the other core but also a storage region required to be read by the core in the present clock cycle. Here, since the intersection of the second storage region set and the third storage region set is required to be extracted, the fourth storage region set may be a null set, or may include one or more storage regions. When the fourth storage region set is a null set, in the present clock cycle, the core may be skipped, and the read instruction corresponding to the third storage region set is delayed to be read in a next clock cycle. In such case, although the core is skipped in the present clock cycle, the presently skipped instruction may be accumulated. After there are accumulated instructions for each storage region, the core will never be skipped again because there is always one storage region that may be selected, so that instructions are only accumulated at the very beginning, and may not be skipped later. Moreover, priority queues corresponding to different clock cycles in a period of time are different, it is fair to each core in long time, and on the whole, there are equal opportunities for respective cores to read each corresponding storage region according to own read instructions.

In some embodiments, when the intersection is a null set, and the next clock cycle comes, a read/write instruction required to be executed in the next clock cycle is acquired.

There may be a read instruction for the third storage region set in the present clock cycle, but a storage region corresponding to the read instruction is in the second storage region set. In such case, the read instruction is skipped in the present clock cycle, and the read instruction may become a read instruction required to be executed in the next clock cycle. Therefore, when the intersection is a null set, the read/write instruction required to be executed in the next clock cycle is acquired when the next clock cycle comes.

An embodiment of the disclosure provides another data read/write method, which includes the following operations.

In S801, before a present clock cycle comes, a core acquires its own sequence number in the present clock cycle.

The sequence number is a position number of each core in a priority queue corresponding to the present clock cycle.

In S802, a first storage region set selected by other cores whose sequence numbers are before the sequence number is determined.

In S803, an unselected second storage region set is determined according to all storage regions of a RAM and the first storage region set.

In S804, a storage region in the second storage region set is determined as an unoccupied storage region.

In S805, when the present clock cycle comes, the core acquires a read/write instruction required to be executed in the present clock cycle.

In S806, a remaining storage space of the storage region in the second storage region set is determined.

In S807, a specified storage region of which a remaining storage space satisfies a condition is determined.

In S808, the unoccupied specified storage region is determined as a target storage region.

In S809, the core performs data read/write on the target storage region in the present clock cycle according to the read/write instruction.

An implementation of S406 when the read/write instruction is a write instruction is provided by operations in S806 and S808. Since each storage region in the second storage region set is not selected by the other core for the core that presently performs selection, the core that presently performs selection may determine which storage region is to be preferentially written according to a use condition of a storage space, and determine the storage region of which the remaining storage space satisfies the condition as the specified storage region. For example, a storage region with a largest remaining storage space is determined as the specified storage region, or a storage region of which a remaining storage space is greater than a preset threshold may be determined as the specified storage region. A write instruction may only require write to the memory rather than write to the specified storage region, so that the target storage region is also not required to be determined according to the write instruction here. Moreover, determining the target storage region according to a size of the remaining storage space is more favorable for fully using the whole storage space in the memory and avoiding conflicts.

In some embodiments, the operation that the specified storage region of which the remaining storage space satisfies the condition is determined includes that: a storage region with a largest remaining storage space is determined as the specified storage region.

When determining the own corresponding target storage region, each core may determine a storage region with a largest remaining storage space in a second storage region set as a specified storage region. If the write instruction includes an identifier of a corresponding storage region, a storage region corresponding to the write instruction in the specified storage regions is determined as the target storage region according to the identifier of the storage region corresponding to the write instruction. If the write instruction includes no identifier of the corresponding storage region, the specified storage region is directly determined as the target storage region. As such, each storage region in the memory is used in a balanced manner in long time, and the utilization rate of the storage space is effectively increased.

An embodiment of the disclosure provides another data read/write method, which includes the following operations.

In S901, before a present clock cycle comes, a core acquires its own sequence number in the present clock cycle.

The sequence number is a position number of each core in a priority queue corresponding to the present clock cycle.

In S902, a first storage region set selected by other cores whose sequence numbers are before the sequence number is determined.

In S903, an unselected second storage region set is determined according to all storage regions of a RAM and the first storage region set.

In S904, a storage region in the second storage region set is determined as an unoccupied storage region.

In S905, when the present clock cycle comes, the core acquires a read/write instruction required to be executed in the present clock cycle.

In S906, a remaining storage space of the storage region in the second storage region set is determined.

In S907, a count value of a respective counter corresponding to each storage region in the second storage region set is determined.

The count value is determined by the number of times, for which the storage region has been written or read, corresponding to the present clock cycle.

In S908, a storage region with a largest remaining storage space is determined as a specified storage region according to the count value of each counter.

In S909, an unoccupied specified storage region is determined as a target storage region.

In S910, the core performs data read/write on the target storage region in the present clock cycle according to the read/write instruction.

An implementation of S807 is provided by operations in S906 and S908. The respective counter is configured for each storage region to determine a use condition of a storage space of the each storage region. The count value of the counter is determined by the number of times for which read or write has been completed. For example, when a data entry is written to a storage space in a clock cycle, a count value of a counter corresponding to the storage region progressively increases. When a data entry is read from a storage region in a clock cycle, and the corresponding storage region is released, a count value of a corresponding counter progressively decreases. Since respective storage regions are obtained by equally dividing the whole storage region of the memory, sizes of the storage spaces of the respective storage regions are the same, and the use condition of the storage space of each storage region may be determined according to a magnitude of the count value for the each storage region. The storage region with the largest remaining storage space may be determined as a specified storage region according to the count values of the counters.

In some embodiments, the count value of the counter is the number of null pointers in a pointer queue of the corresponding storage region. The operation that the storage region with the largest remaining storage space is determined as the specified storage region according to the count value of each counter includes the following operation.

A storage region with most null pointers is determined as the specified storage region according to the number of null pointers in a respective pointer queue corresponding to each storage region.

When a write operation is performed, the null pointers corresponding to each storage region may be stored in a preset pointer queue. When receiving a write instruction, the core selects the pointer queue corresponding to the storage region with the most null pointers, extracts a null pointer from the pointer queue, and performs the write operation according to an address that the null pointer points to.

Figure 3A:
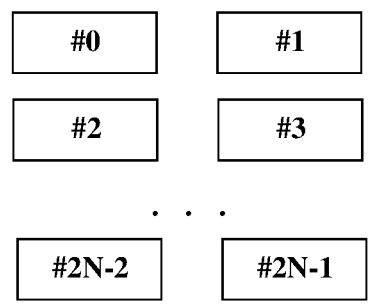
FIG. 3A is a principle diagram of region division of a storage space according to an embodiment of the disclosure.

An embodiment of the disclosure further provides a data read/write method. If an ultra-wide band switch chip is required to be implemented by N cores, a storage region of a multi-read multi-write buffer, i.e., a RAM, is equally divided into X blocks, X being more than or equal to N. As shown in FIG. 3A, X=2N is taken as an example. X=2N RAM blocks are obtained by splitting, i.e., storage region #0, storage region #1, storage region #2, storage region #3, . . . , storage region #(2N−2), and storage region #(2N−1).

2N counters are maintained each labeling the number of remaining space of each RAM block, called Cnt 0, Cnt 1, . . . , and Cnt 2N−1. An implementation for counting is that: 1 is added to a count value of the counter when data is stored in an entry of a RAM block; and when data is read out, and an entry is released, 1 is subtracted from the count value of the counter. A maximum value of the counter is a depth of the RAM block, and represents that the RAM block is presently stored with no data and is null. A minimum value of the counter is 0, and represents that the RAM block has been full at present and no more data may be continued to be stored in the RAM block.

Sequencing is performed according to the magnitudes of the count values of the 2N counters, and if the count value is greater, it indicates that a remaining space of the RAM block is larger at present. When N cores receive M write requests in the same clock cycle (M is less than or equal to N), M RAM blocks with the largest remaining space are selected from the 2N RAM blocks according to a sequence of the counters to write data responsive to the M write requests respectively. As such, write to respective RAM blocks is implemented responsive to the M write requests respectively. For each RAM block, in each clock cycle, there may be at most only one write request and only one write interface is needed.

Here, write is always performed on the RAM block with the largest remaining space by sequencing, so that it is ensured that the utilization efficiency of all the RAM blocks is substantially the same in long time, and the following phenomenon may be avoided. Part of RAM blocks are null and some RAM blocks have been full when not all the buffers are used up, such that not all core requests may be served (since buffers are released randomly, if sequencing is not performed, there may be such a probability that: in the 2N RAM blocks, N+1 RAM blocks have been full but N−1 RAM blocks are null, and consequently, when there are N write requests at the same time, one write request may be discarded, resulting in packet loss when not all the buffers are full).

Figure 3B:
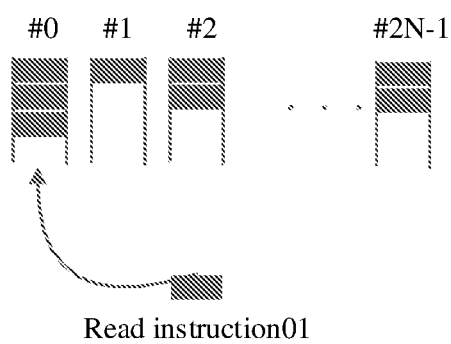
FIG. 3B is a principle diagram of storing a read instruction in a queue according to an embodiment of the disclosure.

For read instructions, as shown in FIG. 3B, each core creates 2N queues (queue #0, queue #1 . . . , and queue #2N−1) corresponding to the 2N RAM blocks respectively. When acquiring a read instruction, each core determines the RAM block to be accessed by the read instruction, and puts the read instruction in the queue corresponding to the RAM block. For example, if read instruction 01 specifies buffer #0 to be accessed, the read instruction is put in queue #0.

By roll polling, a read instruction is selected from each core at first according to a sequence (if there is no read instruction, the core is skipped). That is, Core0, Core1, Core2 . . . , and finally CoreN−1 sequentially perform selection in a first round, Core1, Core2 . . . , CoreN−1, and finally Core0 sequentially perform selection in a second round, and after N rounds, Core0 is the first performing selection again. As such, fairness to each core is ensured.

A read instruction is selected from 2N requests in a single core. If a first selected read instruction corresponds to an ath RAM block (a is more than or equal to 0 and less than or equal to 2N−1), all the cores after the core are required to remove the request queue corresponding to the ath RAM block from queues to be selected. An example is given as follows.

There are four cores, and each core creates 7 queues from 0 to 7. There is made such a hypothesis that a sequence of the cores in a present round is 2, 3, 0, and 1. If Core2 selects a read instruction corresponding to RAM2, Core3 may select a read instruction from queues 0 to 1 and 3 to 7 only. If Core3 selects a read instruction corresponding to RAM4, Core0 may select a read instruction from queues 0 to 1, 3, and 5 to 7 only. If Core0 selects a read instruction corresponding to RAM5, Core1 may select a read instruction from queues 0 to 1, 3, and 6 to 7 only. In this manner, the read instructions selected by respective cores are for different RAM blocks. Therefore, for each RAM block, there may be at most only one read instruction, and only one read interface is needed.

Since almost all read instructions are random, in a certain period of time, a read instruction of a certain core corresponds to only few RAM blocks, and when the core is sequenced behind in a certain round and the RAM blocks corresponding to the read instruction are selected by cores sequenced before the core, the core may be skipped in this round. In such case, there may be such a condition that a bandwidth is not enough. However, due to the randomness of read instructions and a strategy for write instructions (ensuring equal utilization rate of each RAM block), this case may occur at a certain moment only. A read instruction may be accumulated once a round is missed. When the number of RAM blocks corresponding to accumulated read instructions is more than or equal to N, no more read instruction may be missed. Therefore, a bandwidth for reading is always enough in long time.

From the abovementioned read/write manner, the RAM is equally divided into X blocks, and if X is greater, a read/write performance on the RAM is higher, the RAM is written in a more balanced manner, and the probability of read skipping is lower.

An embodiment of the disclosure also provides a data read/write device. Each unit of the device and each module of each unit may be implemented through a processor in the data read/write device, and of course, may also be implemented through a logic circuit. In an implementation process, the processor may be a Central Processing Unit (CPU), a Micro Processor Unit (MPU), a Digital Signal Processor (DSP), a Field-Programmable Gate Array (FPGA), etc.

Figure 4:
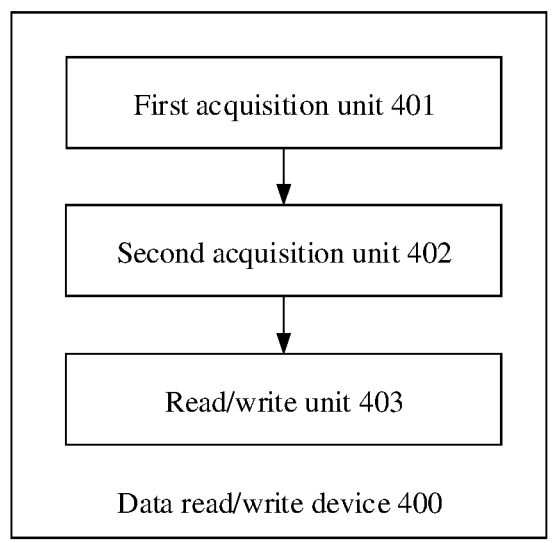
FIG. 4 is a composition structure diagram of a data read/write device according to an embodiment of the disclosure.

FIG. 4 is a composition structure diagram of a data read/write device according to an embodiment of the disclosure. As shown in FIG. 4, the device 400 includes a first acquisition unit 401, a second acquisition unit 402, and a read/write unit 403.

The first acquisition unit 401 is configured to, when a present clock cycle comes, acquire a read/write instruction required to be executed in the present clock cycle.

The second acquisition unit 402 is configured to acquire a target storage region associated with the read/write instruction, the target storage region being an unoccupied storage region in at least two storage regions in a RAM.

The read/write unit 403 is configured to perform data read/write on the target storage region in the present clock cycle according to the read/write instruction.

In some embodiments, the device further includes a storage unit, configured to store a read/write instruction in a respective instruction queue corresponding to each storage region. The first acquisition unit is further configured to, when the present clock cycle comes, acquire the read/write instruction required to be executed in the present clock cycle from the instruction queue.

In some embodiments, the second acquisition unit includes: a first determination module, configured to determine an identifier of a target storage region corresponding to the instruction queue according to an identifier of the instruction queue where the read/write instruction is located; and a second determination module, configured to determine an unoccupied storage region in a storage region corresponding to the identifier of the target storage region as the target storage region.

In some embodiments, the device further includes a determination unit, configured to, before the present clock cycle comes, determine the unoccupied storage region in the at least two storage regions in the RAM.

In some embodiments, the determination unit includes: an acquisition module, configured to, before the present clock cycle comes, acquire an own sequence number in the present clock cycle, the sequence number being a position number of each core in a priority queue corresponding to the present clock cycle; and a third determination module, configured to determine a storage region that is not selected by other cores whose sequence numbers are before the sequence number as the unoccupied storage region according to storage regions selected by the other cores.

In some embodiments, the third determination module includes: a first determination sub-module, configured to determine a first storage region set selected by the other cores whose sequence numbers are before the sequence number; a second determination sub-module, configured to determine an unselected second storage region set according to all storage regions of the RAM and the first storage region set; and a third determination sub-module, configured to determine a storage region in the second storage region set as the unoccupied storage region.

In some embodiments, the read/write instruction is a read instruction, and the second determination module includes: a fourth determination sub-module, configured to determine a third storage region set corresponding to the read instruction according to the identifier of the target storage region; a fifth determination sub-module, configured to determine an intersection of the third storage region set and the second storage region set as a fourth storage region set; and a sixth determination sub-module, configured to determine a storage region in the fourth storage region set as the target storage region.

In some embodiments, the device further includes an acquisition unit, configured to, when the intersection is null, and a next clock cycle comes, acquire a read/write instruction required to be executed in the next clock cycle.

In some embodiments, the read/write instruction is a write instruction, and the second determination module includes: a seventh determination sub-module, configured to determine a remaining storage space of the storage region in the second storage region set; an eighth determination sub-module, configured to determine a specified storage region of which a remaining storage space satisfies a condition; and a ninth determination sub-module, configured to determine an unoccupied specified storage region as the target storage region according to the identifier of the target storage region.

In some embodiments, the eighth determination sub-module is further configured to determine a storage region with a largest remaining storage space as the specified storage region.

In some embodiments, the eighth determination sub-module is further configured to determine a count value of a respective counter corresponding to each storage region in the second storage region set, the count value being determined by the number of times, for which the storage region has been written or read, corresponding to the present clock cycle, and determine the storage region with the largest remaining storage space as the specified storage region according to count values of respective counters.

The above descriptions about the device embodiments are similar to descriptions about the method embodiments, and beneficial effects similar to those of the method embodiments are achieved. Technical details undisclosed in the device embodiments of the disclosure may be understood with reference to the descriptions about the method embodiments of the disclosure.

It is to be noted that, in the embodiments of the disclosure, when implemented in form of software function module and sold or used as an independent product, the data read/write method may also be stored in a computer-readable storage medium. Based on such an understanding, the technical solutions of the embodiments of the disclosure substantially or parts making contributions to a conventional art are not only implemented in chip, may also be embodied in form of software product, and the computer software product is stored in a storage medium, including a plurality of instructions configured to enable a switch chip to execute all or part of the method in each embodiment of the disclosure. The storage medium includes various media capable of storing program codes such as a U disk, a mobile hard disk, a Read Only Memory (ROM), a magnetic disk, or an optical disk. Therefore, the embodiments of the disclosure are not limited to any specific hardware and software combination.

Correspondingly, an embodiment of the disclosure provides a switch chip, which includes a memory, a core, and a RAM. The memory stores a computer program executable by the core. The core runs the computer program to implement the steps of the data read/write method provided in the abovementioned embodiments. The method includes the following operations.

When a present clock cycle comes, a read/write instruction required to be executed in the present clock cycle is acquired.

A target storage region associated with the read/write instruction is acquired, the target storage region being an unoccupied storage region in at least two storage regions in the RAM.

Data read/write is performed on the target storage region in the present clock cycle according to the read/write instruction.

Correspondingly, an embodiment of the disclosure provides another switch chip, which includes a core and a RAM. The core is configured to implement the steps in the data read/write method provided in the abovementioned embodiments.

Correspondingly, an embodiment of the disclosure provides a computer-readable storage medium having stored therein a computer-executable instruction, the computer-executable instruction being configured to execute the steps in the data read/write method provided in the abovementioned embodiments.

It is to be pointed out herein that the above descriptions about the storage medium and device embodiments are similar to the descriptions about the method embodiment, and beneficial effects similar to those of the method embodiment are achieved. Technical details undisclosed in the storage medium and device embodiment of the disclosure are understood with reference to the descriptions about the method embodiment of the disclosure.

Figure 5:
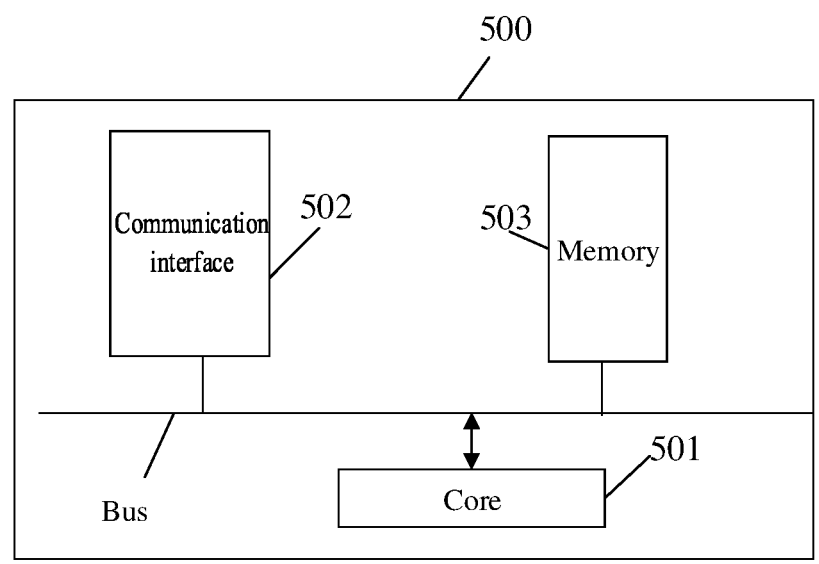
FIG. 5 is a hardware structure diagram of a switch chip according to an embodiment of the disclosure.

It is to be noted that FIG. 5 is a schematic diagram of a hardware entity of a switch chip according to an embodiment of the disclosure. As shown in FIG. 5, the hardware entity of the switch chip 500 includes a core 501, a communication interface 502, and a memory 503.

The core 501 is usually configured to control overall operations of the switch chip 500.

The communication interface 502 may be configured to enable the switch chip 500 to communicate with another terminal or server through a network.

The memory 503 is configured to store an instruction and application executable by the core 501, and may further configured to cache data (for example, image data, audio data, voice communication data, and video communication data) to be processed or having been processed by the core 501 and respective modules in the switch chip 500, and may be implemented through a RAM.

It is to be understood that "one embodiment" and "an embodiment" mentioned in the whole specification mean that specific features, structures or characteristics related to the embodiment is included in at least one embodiment of the disclosure. Therefore, "in some embodiment" or "in an embodiment" appearing at any place of the whole specification does not always refer to the same embodiment. In addition, these specific features, structures or characteristics may be combined in one or more embodiments freely as appropriate. It is to be understood that, in each embodiment of the disclosure, the magnitude of the sequence number of each process does not mean an execution sequence and the execution sequence of each process should be determined by its function and an internal logic and should not form any limit to an implementation process of the embodiments of the disclosure. The sequence numbers of the embodiments of the disclosure are adopted not to represent superiority-inferiority of the embodiments but only for description.

It is to be noted that terms "include" and "comprise" or any other variant thereof is intended to cover nonexclusive inclusions herein, so that a process, method, object, or device including a series of elements not only includes those elements but also includes other elements which are not clearly listed or further includes elements intrinsic to the process, the method, the object, or the device. Under the condition of no more limitations, an element defined by the statement "including a/an . . . " does not exclude existence of the same other elements in a process, method, object, or device including the element.

In some embodiments provided by the disclosure, it is to be understood that the disclosed device and method may be implemented in another manner. The device embodiment described above is only schematic, and for example, division of the units is only logic function division, and other division manners may be adopted during practical implementation. For example, multiple units or components may be combined or integrated into another system, or some characteristics may be neglected or not executed. In addition, coupling or direct coupling or communication connection between each displayed or discussed component may be indirect coupling or communication connection implemented through some interfaces, devices or units, and may be electrical or mechanical or adopt other forms.

The units described as separate parts may or may not be physically separated, and parts displayed as units may or may not be physical units, and namely may be located in the same place, or may also be distributed to multiple network units. Part of all of the units may be selected according to a practical requirement to achieve the purposes of the solutions of the embodiments.

In addition, respective function units in respective embodiments of the application may be integrated into a processing unit, each unit may also serve as an independent unit and two or more than two units may also be integrated into a unit. The integrated unit may be implemented in a hardware form and may also be implemented in form of hardware and software function unit.

Those of ordinary skill in the art should know that all or part of the steps of the method embodiment may be implemented by related hardware instructed through a program, the program may be stored in a computer-readable storage medium, and the program is executed to execute the steps of the method embodiment. The storage medium includes various media capable of storing program codes such as a mobile storage device, a ROM, a magnetic disk, or an optical disc.

When implemented in form of software function module and sold or used as an independent product, the integrated unit of the application may also be stored in a computer-readable storage medium. Based on such an understanding, the technical solutions of the embodiments of the application substantially or parts making contributions to the conventional art may be embodied in form of software product, and the computer software product is stored in a storage medium, including a plurality of instructions configured to enable a switch chip to execute all or part of the method in each embodiment of the application. The storage medium includes various media capable of storing program codes such as a mobile hard disk, a ROM, a magnetic disk, or an optical disc.

Described above are merely implementations of the application and not intended to limit the scope of protection of the application. Any variations or replacements apparent to those skilled in the art within the technical scope disclosed by the application shall fall within the scope of protection of the application. Therefore, the scope of protection of the application shall be subject to the scope of protection of the claims.

The invention claimed is:

1. A data read/write method, comprising:
   determining, by a core, a storage region that is not occupied by other cores in at least two storage regions in a Random Access Memory (RAM) before a present clock cycle comes, comprising:
      before the present clock cycle comes, acquiring an own sequence number in the present clock cycle, the own sequence number being a position number of each core in a priority queue corresponding to the present clock cycle; and
      determining a storage region that is not selected by the other cores whose sequence numbers are before the own sequence number as the storage region that is not occupied by the other cores according to storage regions selected by the other cores;
   when the present clock cycle comes, acquiring, by the core, a read/write instruction required to be executed in the present clock cycle;
   acquiring, by the core, a target storage region associated with the read/write instruction, the target storage region being the region that is not occupied by other cores in the at least two storage regions in the RAM; and
   performing, by the core, data read/write on the target storage region in the present clock cycle according to the read/write instruction.

2. The method of claim 1, wherein determining the storage region that is not selected by the other cores whose sequence numbers are before the own sequence number as the storage region that is not occupied by the other cores according to the storage regions selected by the other cores comprises:
   determining a first storage region set selected by the other cores whose sequence numbers are before the own sequence number;
   determining an unselected second storage region set according to all storage regions of the RAM and the first storage region set; and
   determining a storage region in the second storage region set as the unoccupied storage region that is not occupied by the other cores.

3. The method of claim 2, wherein when the read/write instruction is a read instruction, the method further comprises:
   storing, by the core, the read instruction in a respective instruction queue corresponding to each storage region,
   wherein acquiring, by the core, the read/write instruction required to be executed in the present clock cycle when the present clock cycle comes comprises: when the present clock cycle comes, acquiring, by the core, the read instruction required to be executed in the present clock cycle from the instruction queue.

4. The method of claim 3, wherein acquiring, by the core, the target storage region associated with the read/write instruction comprises:
   determining, by the core, an identifier of the target storage region corresponding to the instruction queue according to an identifier of the instruction queue where the read instruction is located; and
   determining the storage region that is not occupied by the other cores in a storage region corresponding to the identifier of the target storage region as the target storage region.

5. The method of claim 4, wherein determining the storage region that is not occupied by the other cores in the storage region corresponding to the identifier of the target storage region as the target storage region comprises:
   determining a third storage region set corresponding to the read instruction according to the identifier of the target storage region;
   determining an intersection of the third storage region set and the second storage region set as a fourth storage region set; and
   determining a storage region in the fourth storage region set as the target storage region.

6. The method of claim 5, further comprising:
   in response to the intersection being null, acquiring a read/write instruction required to be executed in a next clock cycle when the next clock cycle comes.

7. The method of claim 2, wherein the read/write instruction is a write instruction, and acquiring, by the core, the target storage region associated with the read/write instruction comprises:

determining a remaining storage space of the storage region in the second storage region set;
determining a specified storage region of which a remaining storage space satisfies a condition; and
determining the specified storage region that is not occupied by the other cores as the target storage region.

8. The method of claim 7, wherein determining the specified storage region of which the remaining storage space satisfies the condition comprises:
determining a storage region with a largest remaining storage space as the specified storage region.

9. The method of claim 8, wherein determining the storage region with the largest remaining storage space as the specified storage region comprises:
determining a count value of a respective counter corresponding to each storage region in the second storage region set, the count value being determined by a number of times, for which the storage region has been written or read, corresponding to the present clock cycle; and
determining the storage region with the largest remaining storage space as the specified storage region according to the count value of each counter.

10. The method of claim 9, wherein the count value of the counter is a number of null pointers in a pointer queue for a storage region corresponding to the counter, and determining the storage region with the largest remaining storage space as the specified storage region according to the count value of each counter comprises:
determining a storage region with most null pointers as the specified storage region according to the number of null pointers in a respective pointer queue corresponding to each storage region.

11. A data read/write device, comprising:
a core; and
memory for storing instructions executable by the core;
wherein the core is configured to execute the instructions to:
determine a storage region that is not occupied by other cores in at least two storage regions in a Random Access Memory (RAM) before a present clock cycle comes, comprising:
before the present clock cycle comes, acquiring an own sequence number in the present clock cycle, the own sequence number being a position number of each core in a priority queue corresponding to the present clock cycle; and
determining a storage region that is not selected by the other cores whose sequence numbers are before the own sequence number as the storage region that is not occupied by the other cores according to storage regions selected by the other cores;
when the present clock cycle comes, acquire a read/write instruction required to be executed in the present clock cycle;
acquire a target storage region associated with the read/write instruction, the target storage region being the storage region that is not occupied by other cores in the at least two storage regions in the RAM; and
perform data read/write on the target storage region in the present clock cycle according to the read/write instruction.

12. The device of claim 11, wherein the core is further configured to:
determine a first storage region set selected by the other cores whose sequence numbers are before the own sequence number;
determine an unselected second storage region set according to all storage regions of the RAM and the first storage region set; and
determine a storage region in the second storage region set as the storage region that is not occupied by the other cores.

13. The device of claim 12, wherein when the read/write instruction is a read instruction, the core is further configured to:
store the read instruction in a respective instruction queue corresponding to each storage region; and
when the present clock cycle comes, acquire the read instruction required to be executed in the present clock cycle from the instruction queue.

14. The device of claim 13, wherein the core is further configured to:
determine an identifier of the target storage region corresponding to the instruction queue according to an identifier of the instruction queue where the read instruction is located; and
determine the storage region that is not occupied by the other cores in a storage region corresponding to the identifier of the target storage region as the target storage region.

15. The device of claim 14, wherein the core is further configured to:
determine a third storage region set corresponding to the read instruction according to the identifier of the target storage region;
determine an intersection of the third storage region set and the second storage region set as a fourth storage region set; and
determine a storage region in the fourth storage region set as the target storage region.

16. The device of claim 15, wherein the core is further configured to:
in response to the intersection being null, acquire a read/write instruction required to be executed in a next clock cycle when the next clock cycle comes.

* * * * *